United States Patent [19]

Rees

[11] Patent Number: 4,928,187

[45] Date of Patent: May 22, 1990

[54] METHOD AND APPARATUS FOR ENCODING AND DECODING BINARY DATA

[75] Inventor: Theodore D. Rees, Mountain View, Calif.

[73] Assignee: Laserdrive Limited, Santa Clara, Calif.

[21] Appl. No.: 16,949

[22] Filed: Feb. 20, 1987

[51] Int. Cl.$^5$ .............................................. G11B 5/09
[52] U.S. Cl. ................................................... 360/40
[58] Field of Search ................... 369/59; 360/40, 39; 340/347 DD; 375/23, 34, 60; 341/55, 59, 69

[56] References Cited

U.S. PATENT DOCUMENTS

| | | | |
|---|---|---|---|
| 3,689,899 | 9/1972 | Franaszek | 340/172.8 |
| 3,995,264 | 11/1976 | Ouchi | 340/347 |
| 4,124,778 | 11/1978 | Amass | 340/347 |
| 4,183,066 | 1/1980 | Anderson | 360/40 |
| 4,218,770 | 8/1980 | Weller | 375/118 |
| 4,337,458 | 6/1982 | Cohn et al. | 340/347 |
| 4,393,458 | 7/1983 | Fung | 364/900 |
| 4,566,091 | 1/1986 | Gerard et al. | 369/47 |
| 4,802,154 | 1/1989 | Verboom et al. | 360/40 |

OTHER PUBLICATIONS

Jordan Isailovic, "Codes for Optical Recording", *SPIE*, vol. 529, Optical Mass Data Storage, (1985), pp. 161–168.

George V. Jacoby, "Ternary 3PM Magnetic Recording Code & System", *IEEE Transactions on Magnetics*, vol. Mag-17, No. 6, Nov. 1981, pp. 3326–3328.

George V. Jacoby et al., "Binary Two-Thirds Rate Code with Full Word Look-Ahead", *IEEE Transactions on Magnetics*, vol. Mag-20, No. 5, Sep. 1984, pp. 709–714.

*Primary Examiner*—Vincent P. Canney
*Attorney, Agent, or Firm*—Townsend and Townsend

[57] ABSTRACT

An apparatus for encoding and decoding binary data in a data transmission system, such as a magnetic or optical medium data storage system is disclosed. The encoding process uses a modulation code wherein each data bit is encoded into a predetermined one of five code words, each code word including three code bits, such that 2, 4, 6, or 8 "0" code bits are generated between each "1" code bit. A "1" code bit signifies a signal transition and a "0" code bit signifies no signal transition. In the process of decoding, each series of three code bits, defined with respect to a detected synchronization signal, are decoded using the inverse of the encoding process to convert the code bits back into data bits. The synchronization pattern generated during the encoding process includes at least ten successive "0" bits.

28 Claims, 11 Drawing Sheets

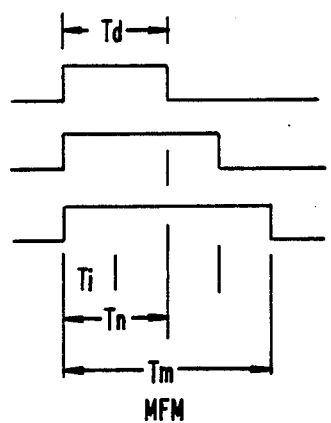
FIG._1A.
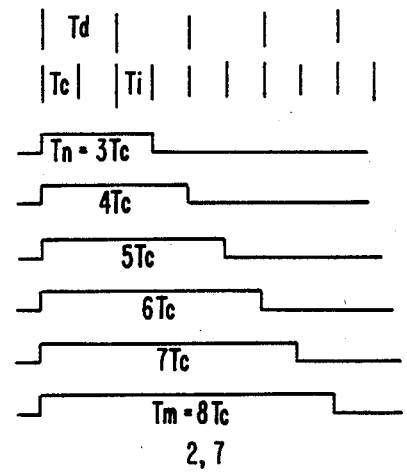
FIG._1B.
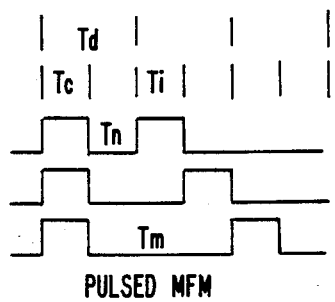
FIG._1C.
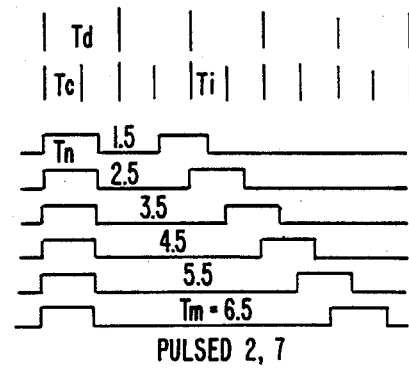
FIG._1D.

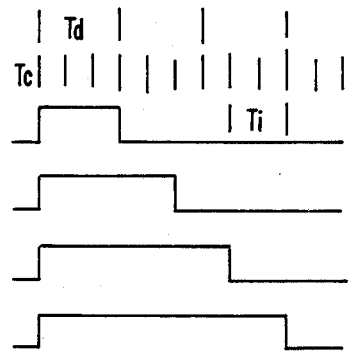
FIG._2A.
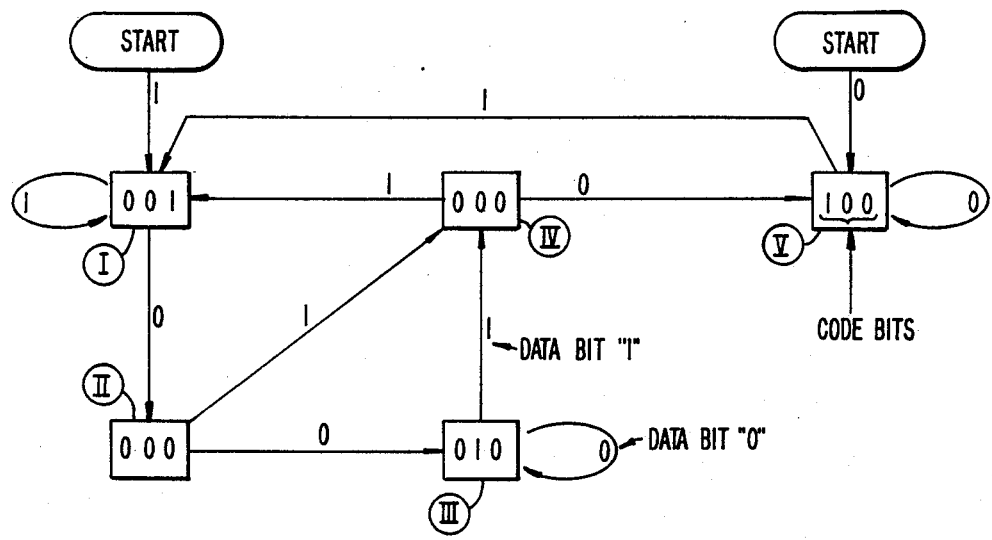
FIG._2B.
| | NRZ | RZ |
|---|---|---|
| 0000 | STAY HIGH OR STAY LOW | LOW ONLY ---- |
| 0010 | ⎯⎯⏉⎯ OR ⎯⏋⎯⎯ | ⎯⎯⊓⎯ |
| 0110 | ⎯⊓⎯⎯ OR ⎯⎯⊔⎯ | ⎯⊓⎯ |
| 1010 | ⎯⎯⏉⎯ OR ⎯⏋⎯⎯ | ⊓⊓ |
FIG._2C.

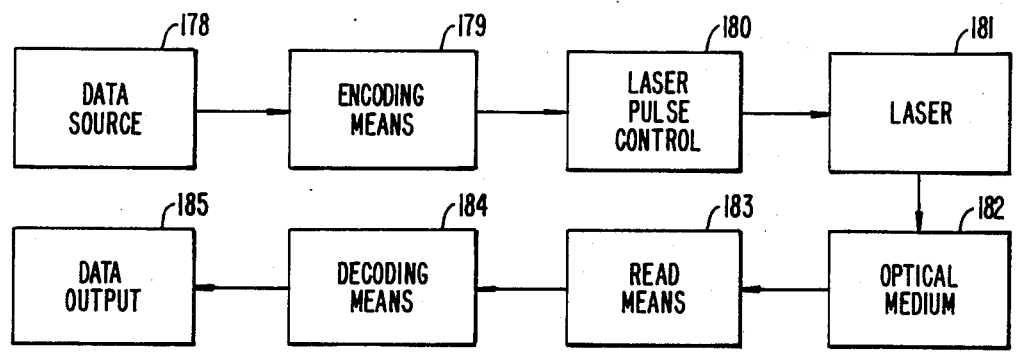
FIG._3A.
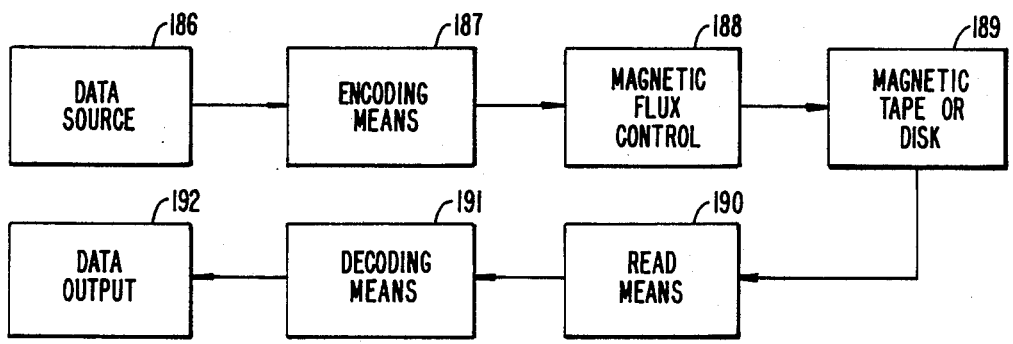
FIG._3B.
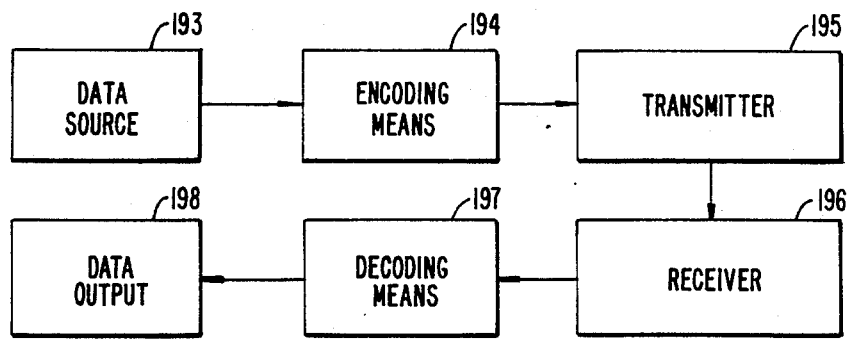
FIG._3C.

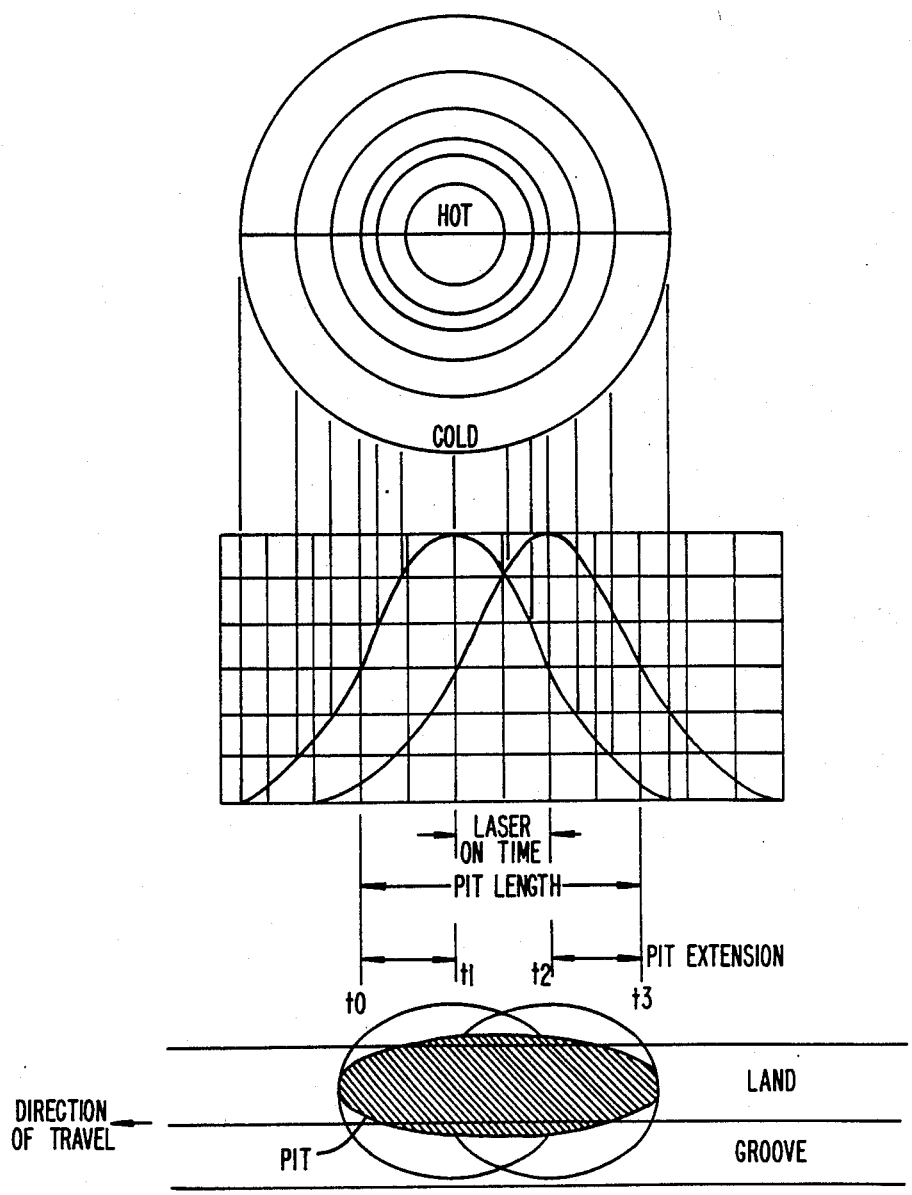
FIG._4.

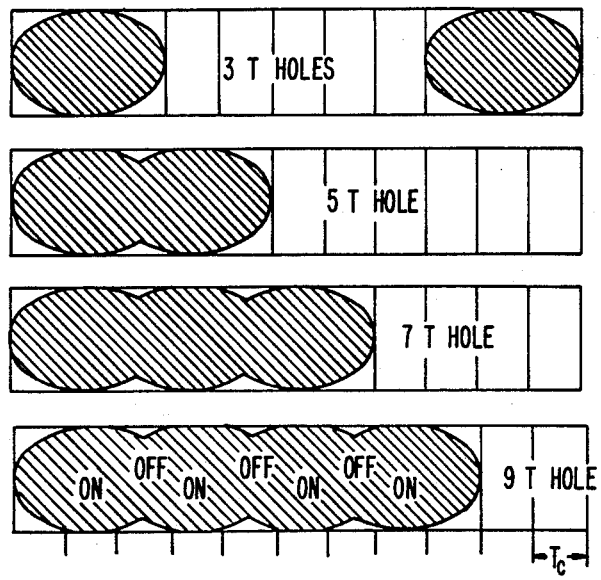
FIG._5.

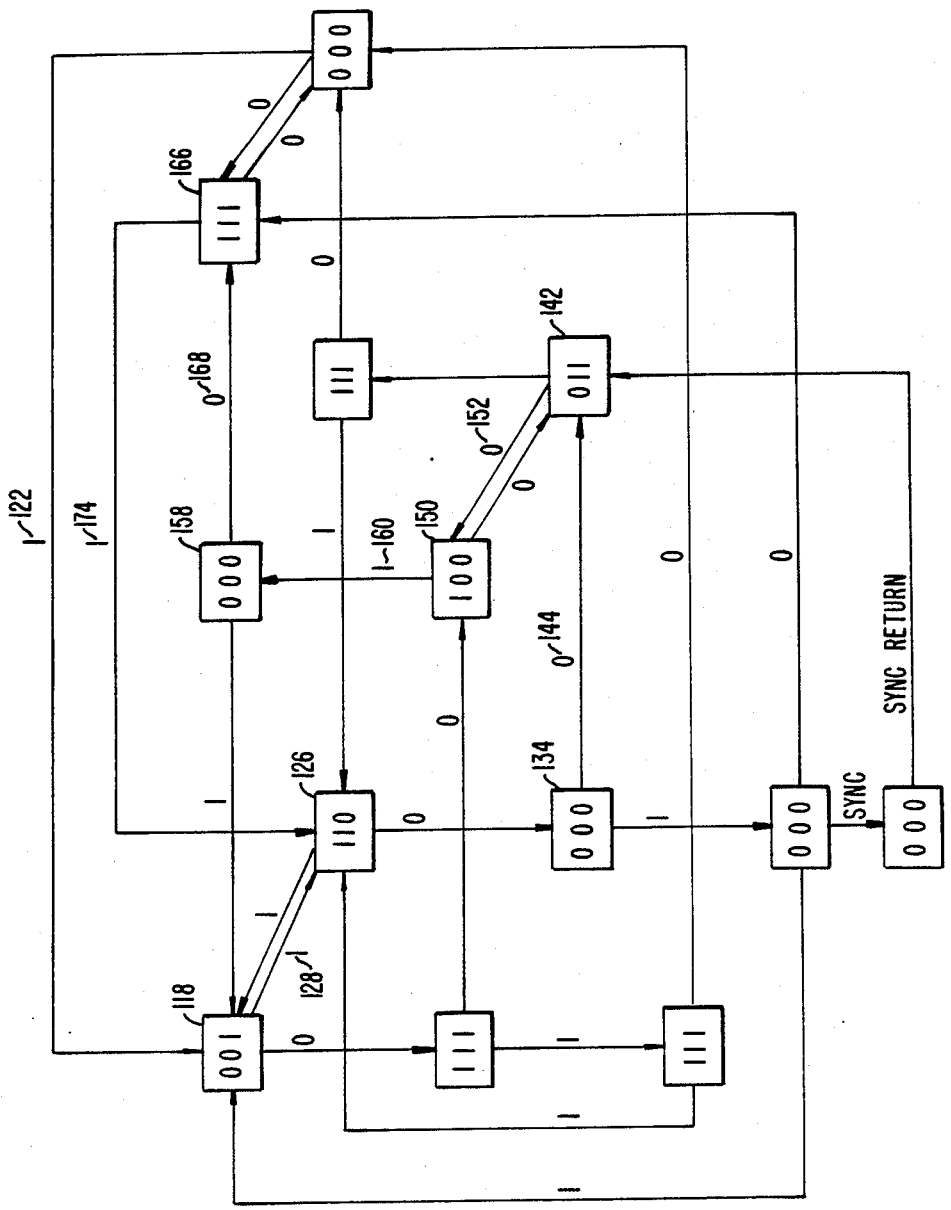
FIG._6.

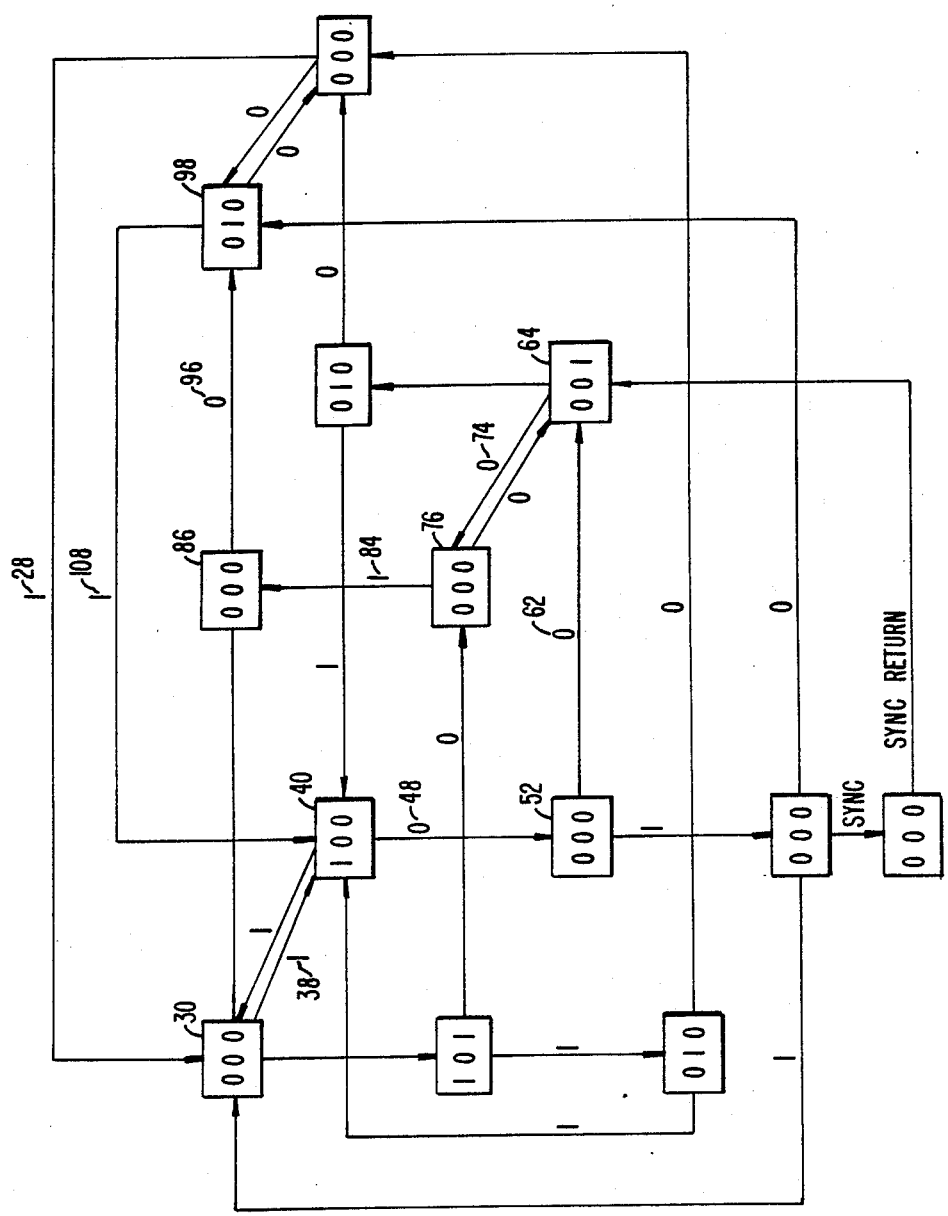
FIG._7.

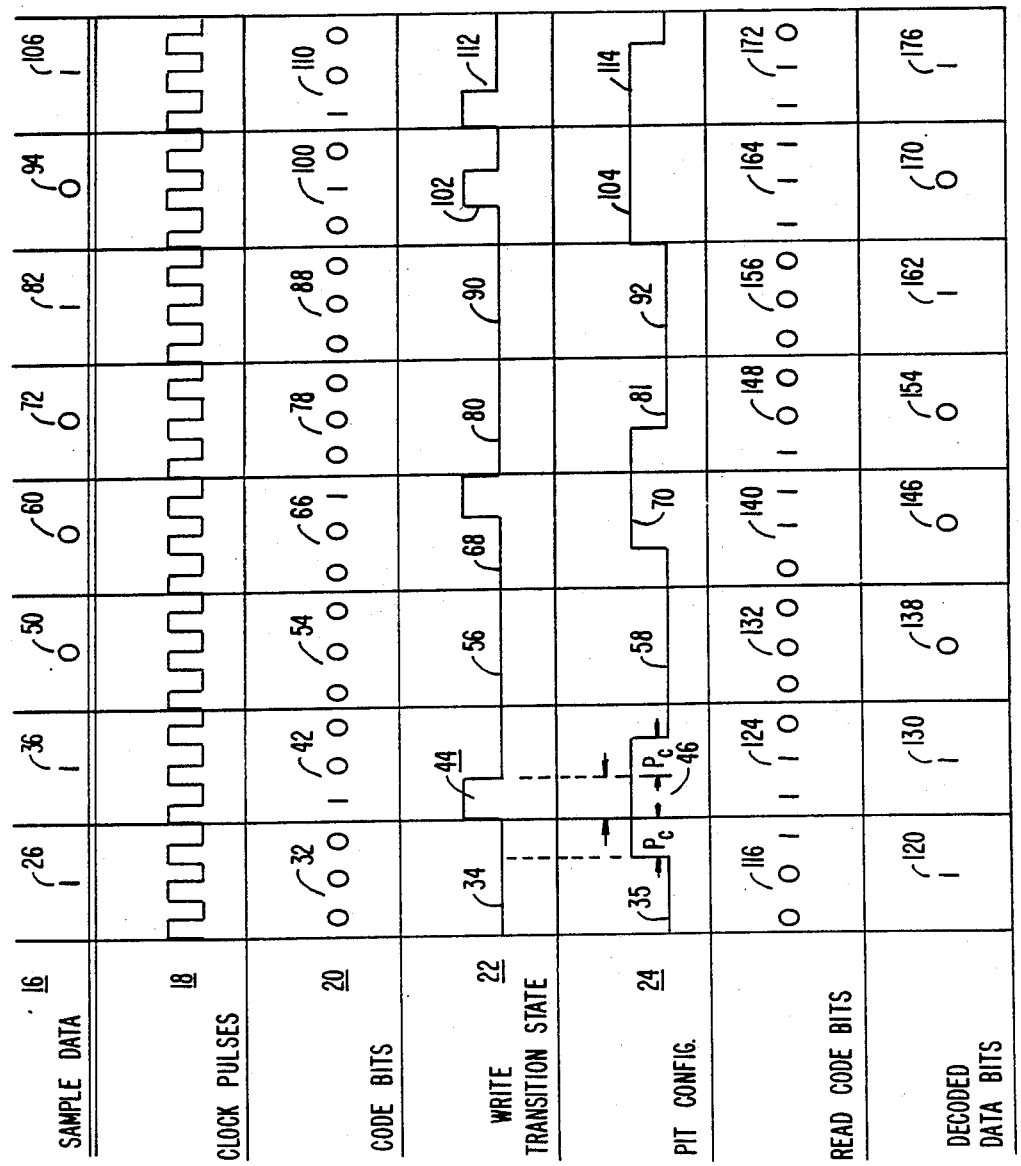
FIG._8.

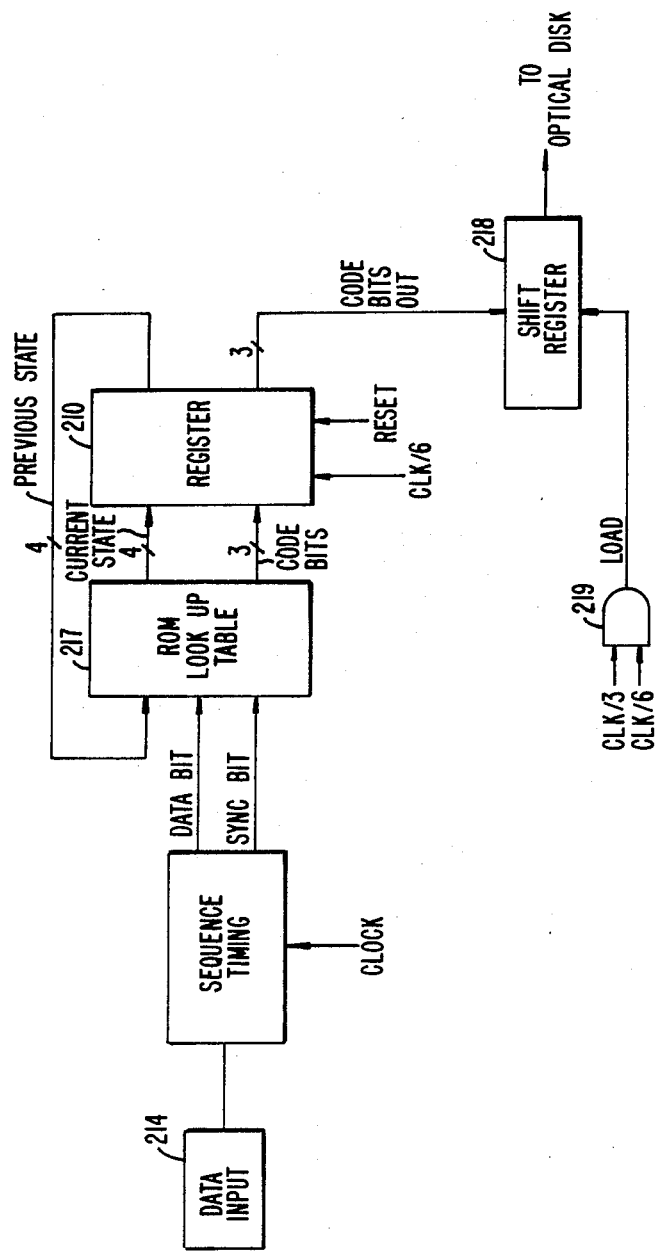
FIG._9.

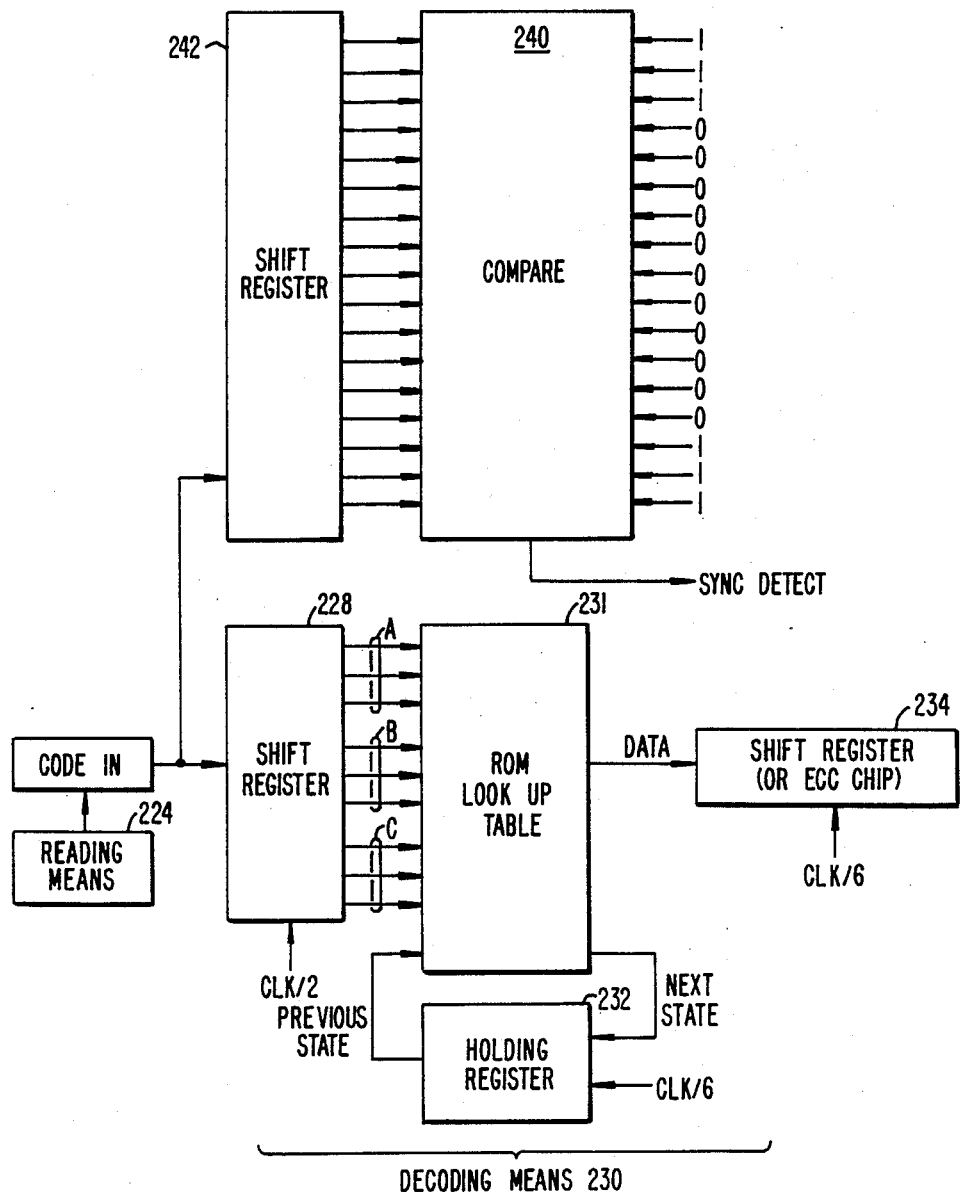
FIG._10.

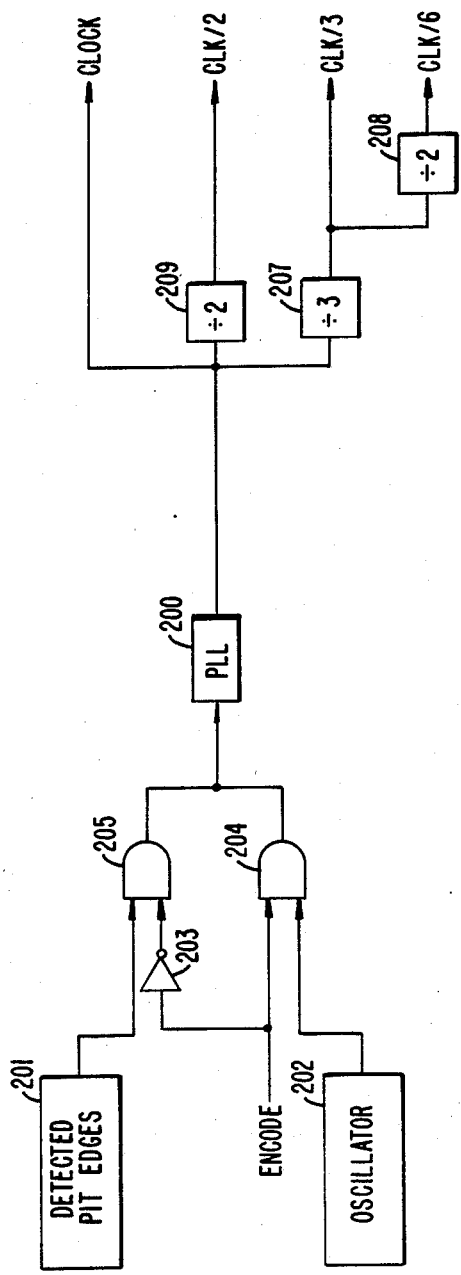
FIG._11.

METHOD AND APPARATUS FOR ENCODING AND DECODING BINARY DATA

BACKGROUND OF THE INVENTION

1. Field of Invention

This invention relates generally to the field of encoding and decoding of data in a data transmission system and, more particularly, to the encoding of binary data into code bits and the subsequent decoding of said code bits such that data transmission capacity is increased and error propagation is minimized.

2. Prior Art

Since the invention of the telegraph, various coding methods have been used for encoding and recovering electrical signals for a variety of reasons. An infinite number of possible coding schemes can be used in data transmission systems. In order to appreciate the advantages of a particular coding apparatus and method, it is important to understand what type of code is being used, what the code's parameters are, and how a particular code compares with other codes in terms of industry accepted standards of merit.

Four types of codes are generally used. These include data translation codes, data encryption codes, error correction codes and modulation codes. Modulation codes are the type of codes used in data transmission applications, such as in magnetic or optical recording systems. The present invention relates to the use of such a modulation code in digital data transmission systems, and is particularly advantageous when used in optical recording systems.

In a modulation code, the parameters to be defined for a given code include the number of data bits to be converted to code bits in a given translation step, the number of resultant code bits obtained from said translation step and whether or not the ratio of code bits to data bits is fixed or variable. In a simple code, for example, each data bit may be converted into three code bits, with this conversion ratio being constant or fixed. The encoding of a particular data bit or bits into a corresponding code bit or bits is performed in a conventional manner using either a fixed look-up table, a state dependent look-up table or a state and source dependent look-up table. The code may also enable self-clocking during decoding, i.e. where the clock is generated from the received code bits, or require an external clock. The purpose of all such codes is to improve the efficiency and the reliability of the data recording or transmission system.

All self-clocking modulation codes are also referred to as run length limited codes (RLL). In such codes, traditionally, each one bit in a coded bit sequence is separated from the nearest adjacent one bit by a number of zero bits at least equal to the minimum quantity d, in order to ensure freedom from inter-symbol interference during recording or transmission, but not exceeding a maximum number k which is required for self-clocking purposes. Examples of run length limited codes employing variable length words is disclosed in U.S. Pat. No. 3,689,899 to P.A. Franaszek.

A problem with using the above described nomenclature is that this nomenclature neither adequately characterizes certain types of modulation codes wherein not all lengths of zero's between d and k are allowed nor distinguishes return to zero (RZ) types of codes from non-return to zero codes. Non-return to zero (NRZ) codes are typically utilized in magnetic media applications wherein flux reversals are written onto the media. In an NRZ code, a binary "1" represents a change in the state of the data, e.g. a flux reversal, regardless of the current polarity of the written data, while a binary "0" represents the absence of such a transition. In optical storage systems, the medium is asymmetrical in that the change in reflectivity of the medium, i.e., the pit or hole generated by a laser, is not the same as an unwritten area. Consequently, RZ codes are used in a writeable optical recording system. With such codes, during a writing process, a binary "1" signifies the on-time of the laser and a binary "0" indicates the off-time of the laser.

Thus, for purposes of comparing both RZ and NRZ codes known in the art with the present invention, the following definitions will be used:

1. n=the number of source data bits for conversion in each encoding step.
2. m=the number of destination code bits per conversion.
3. Td=one data bit time interval.
4. Tc=one code bit unit of time where Tc= Td×n/m.
5. Tn=the time duration of the minimum number of Tc intervals upon read back of information from the medium.
6. Tm=the time duration of the maximum number of Tc intervals upon read back of information from the medium.
7. Tu=T2, T3, etc., the time duration of the intermediate Tc intervals used in the code that can exist upon read back of information from the medium.
8. Ti=the time duration of the minimum number of Tc intervals between Tn, Tu or Tm.

It is well known that a good modulation code will have a high data density, a large detection window, a low frequency ratio and a low error propagation. It can be seen that these values cannot all be optimized simultaneously, so that a given modulation code will tend to favor one or more of these figures of merit over others.

Using the above suggested nomenclature, the following formulas can be used to quantify the above described figures of merit for any particular modulation code:

1. D=density=the measure of data density relative to the bandwidth of the system, i.e., D=Tn/Td.
2. W=the detection window, i.e., W=Ti/Tn.
3. FR=the frequency ratio, i.e., FR= Tm/Tn.
4. EP=the error propagation distance in units of Td, i.e., EP=Tm/Td (approx.).

TABLE 1

| Code Type | Density | Detection Window | Frequency Ratio | Error propagation distance |
|---|---|---|---|---|
| FM | ½ | ½ | 2 | 1 |
| MFM | 1 | ½ | 2 | 2 |
| GCR | 4/5 | 1 | 3 | 4 |
| 3 PM | 3/2 | ½ | 4 | 6 |
| 1, 7 | 4/3 | ½ | 4 | 5 |
| 2, 7 | 3/2 | ½ | 8/3 | 4 |
| EFM Pulsed | 4/3 | ½ | 4 | 8 |
| MFM Pulsed | ½ | 1 | 3 | 2 |
| 2, 7 | ¾ | ¾ | 13/3 | 4 |
| OEM | 1 | ½ | 3 | 3 |

A number of modulation codes have been devised and are known and used in the art. Figures of merit for various such codes are tabulated in Table 1 for comparison purposes. One of the first modulation codes used for encoding information on rotating magnetic disks utilized a dual frequency or FM (frequency modulation) coding scheme. In this code, the time intervals of 1 and 2 are used to encode data. In the FM coding scheme, using the above suggested nomenclature, the parameters of this code are $n=1$, $m=2$, $Td=2Tc$, $Tn=Tc$ and $Tm=2Tc$. Figures of merit for the FM code are shown in Table 1.

The FM code was complemented and somewhat replaced by an improved code known as MFM (modified frequency modulation). Both the FM and MFM coding systems have rules which determine the flux patterns which are to be recorded on a magnetic medium for all patterns of incoming data in a magnetic recording system. The MFM code uses the time intervals of 2, 3 and 4 to encode data. The parameters of this code include $n=1$, $m=2$, $Td=2Tc$, $Tn=2Tc$, $Tm=4Tc$, $Tu=3Tc$ and $Ti=Tc$. The figures of merit illustrated in Table 1 for the MFM code show that the data density generated by the MFM code is twice that of the FM code but the detection window is half that of the FM code.

Another significant code in limited use is called the GCR (group coding recording) code, also known as the "4/5 code". In this code, each sequence of 4 data bits are converted into a 5 bit code pattern. Thus, $n=4$, $m=5$, and $Td=5/4Tc$, $Tn=Tc$, $Tm=3Tc$, $Tu=2Tc$ and $Ti=Tc$. This code uses the time intervals of 1, 2 and 3 to encode data. As seen in Table 1, this code has a lower density and a higher frequency ratio than the MFM code, but it has a much larger detection window than the MFM and FM codes.

A code called 3PM was developed to achieve greater recording density. This code uses look-up tables with merging to achieve a density of 1.5. The timing intervals used are 3, 4, 5, 6, 7, 8, 9, 10, 11 and 12 and the code parameters are $n=3$, $m=6$, $Td=2Tc$, $Tn=3TC$, $Tm=12Tc$ and $Ti=Tc$. The figures of merit for this code are also shown in Table 1.

Another conventional modulation code is called the 1,7 code. This code encodes 2 data bits into 3 code bits using data and state dependency. As seen in the figures of merit shown in Table 1, this code has a higher data density than the previously mentioned codes with a fairly large detection window. However, it has a large frequency ratio and larger error propagation. The time intervals used are 2, 3, 4, 5, 6, 7 and 8 and the code parameters are $n=2$, $m=3$, $Td=3/2Tc$, $Tn=2Tc$, $Tm=8Tc$, $Tu=3,4,5,6,7Tc$ and $Ti=Tc$.

A modulation code that is presently popular is called the 2,7 code. This code uses a very complicated data and state diagram to achieve a combination of superior performance parameters. This codes uses the time intervals of 3, 4, 5, 6, 7 and 8 to encode data. The code parameters for this code are $n=1$, $m=2$, $Td=2Tc$, $Tn=3Tc$, $Tm=8Tc$, $Tu=4,5,6,7Tc$, and $Ti=Tc$. The figures of merit for the 2,7 code is also shown in Table 1.

More recent codes have been developed to enable more efficient writing of data onto an optical storage medium. In such cases, instead of generating non-return to zero signals utilizable in magnetic flux reversal media, the characteristics of optical storage media require the controlling of the on time of a laser. One recently introduced such code, that is useable on prestamped optical media, is called the EFM code. See, e.g., K.A. Immink, "Modulation Systems for Digital Audio Discs with Optical Readout", *Proc. IEEE Int. Conf. on Acoustics, Speech and Signal Processing*, Atlanta 1981, pp. 587–589. This code maps 8 data bits to 15 code bits using a look-up table. Then 3 more code bits are added between code words to limit the run length of a given sequence. The EFM code uses the time intervals of 3, 4, 5, 6, 7, 8, 9, 10, 11 and 12 to encode data. The code parameters for this code are $n=8$, $m=18$, $Td=9/4Tc$, $Tn=3Tc$, $Tm=12Tc$ and $Ti=Tc$. The figures of merit for this code are also shown in Table 1. It does not appear that this code has any merit over the previously described 2,7 code.

Other encoding schemes comprising adaptions of previous encoding schemes are now being introduced for use on optical disk media. One such proposed adaptation adapts the MFM code and a second adapts the 2,7 code. Because of the difficulty in controlling the size of a hole or bit formed in an optical media, these codes define a situation wherein a previous 1 code bit indicates that a hole is formed while a code zero bit means that no hole has been formed. As previously mentioned, the parameters and figures of merit formulas of these codes change when this is done. Specifically, for a pulsed MFM code, the time interval of a hole is 1, the time intervals between holes are 1, 2, and 3 and the timing parameters are $n=1$, $m=2$, $Td=2Tc$, $Tn=Tc$, $Tm=3Tc$ and $Ti=Tc$. The figures of merit for the pulsed MFM is shown in Table 1. Note that these figures of merit indicate that this modified code is not as good as the parameters for the original MFM code, or even the early FM code. The pulse 2,7 code has slightly better figures of merit. The timing parameters of the 2,7 pulse code is $n=1$, $m=2$, $Td=2Tc$, $Tn=3/2Tc$, $Tm=13/2Tc$ and $Ti=Tc$. The figures of merit for the pulse 2,7 code are also shown in Table 1.

A disadvantage inherent in the use of laser light energy to store encoded data on an optical medium is that pitting cannot be completely restricted to the area defined by the period of laser beam irradiation during writing. When a pulse of laser light irradiates the medium surface during writing for a selected time as the medium moves, the leading and trailing edges of the pit extend somewhat beyond the laser on-time because the thermal propagation of the laser energy on the recording surface continues for a time beyond the selected laser on-time. This pit extension depends on the thermal characteristics of the particular optical disk being used. The severity of pit extension is increased as the length of the laser irradiation is increased, due to the accumulation of thermal effects, resulting in distortion of the encoded data when read. This also results in an increased pit edge transition jitter.

Because of the problem of non-uniform pit extension and excessive pit edge transition jitter, optical systems in the prior art have read encoded data by detecting the presence or absence of a pit using the transition at the center of the pit (referred to as pulse position modulation or PPM) within selected clock time periods. A drawback of PPM is that it limits the maximum density of data that can be written to and read from the medium. That is, only one transition can be detected for each pit, whereas with pit edge transition detection (referred to as pulse width modulation), each pit has two transitions that represent data. Although such pit center detection systems are capable of detecting pit edge transition, according to the prior art, doing so would result in a high error rate due to the variation of the spacing between edges caused by variation in pit edge extension and the resultant increased jitter in the positioning of the pit edge transitions. Consequently, even though a pit edge transition detection scheme would have the great advantage of effectively doubling the data storage capacity of a medium, this technique is not generally used in the prior art. No known scheme is currently known in the art where pit edge detection is used in a write once optical recording system.

The only prior art optical storage systems wherein pit edge modulation is used is in CD-audio and CD-ROM optical recording systems. A typical storage capacity of greater than 550 megabytes on a 120 millimeter diameter CD-ROM disk is readily achievable due to the use of pit edge modulation and EFM coding. The success of this coding is enabled because of the ability to form high quality long pits with low edge jitter on the medium. This is possible because the pits on a CD-ROM disk are generated on a photo-resist coated optical quality glass disk by a high precision and high power laser recording system under carefully controlled conditions. Such processing conditions are not duplicatable on conventional write-once or erasable optical recording systems.

Consequently, what is desired is an apparatus and method for the encoding and subsequent decoding of data using a modulation code which, in a preferred embodiment, enables the edges of the pits formed on an optical medium by a laser to be controlled so as to enable pit edge detection during decoding of the data from the optical medium. What is further desired is a modulation code which enables data to be encoded onto the media using longer pits without increasing jitter in the positioning of the pit edge transitions. What is also desired is an encoding scheme which achieves a balance of figures of merit competitive with codes used in the encoding of data onto magnetic media and superior to prior art optical modulation codes.

SUMMARY OF THE INVENTION

It is therefore an object of the present invention to provide an improved apparatus and method for encoding data in a data transmission system so that data density is increased, detection window time is maximized and encoding errors are minimized.

It is another object of the present invention to provide means for encoding data in an optical storage system such that the encoded data can be read from an optical storage medium by controlling of the extent of the physical alteration of the recording surface of the medium.

It is a another object of the present invention to provide means for encoding data on an optical storage medium using an optical edge modulation code (OEM) such that pit extension is controlled and laser life is lengthened.

It is a further object of the present invention to provide an apparatus and method for encoding data which enables the generation of multiple non-continuous laser write pulses to create pits of varying length in the medium whose edges are controlled so as to minimize variations in resultant pit extension between pits of different length and to reduce pit edge transition jitter.

It is a further object of the present invention to provide self-clocking means when data is read from an optical medium.

It is another object of the present invention to provide synchronization marks that are of a minimum size and not confusable with data.

According to the present invention, binary data words, each comprising a plurality of data bits, are encoded, one data bit at a time, into a predetermined one of five code words. Each code word includes three code bits, wherein a "1" code bit signifies a signal transition and a "0" code bit signifies no signal transition, regardless of the present polarity of the signal. The encoding is further constrained to permit the occurrence of only two, four, six or eight "0" code bits between each "1" code bit. Means are also included for transmitting each of these encoded code words, and for thereafter decoding the code words for reconverting the code words into binary data words. Means are also provided for generating a synchronization signal at predetermined intervals having at least ten successive "0" bits and for thereafter decoding the occurrence of such synchronization signals in the data transmission.

The present encoding system is particularly advantageous in an optical storage system since it provides means for causing the generation of discontinuous pulses of energy as a function of pit edge extension to write encoded data to an optical recording medium. The discontinuity of the pulses enables the pit extension generated by the thermal effects of the laser on the medium during writing to be controlled, thereby creating more accurate and reliable edge definition of the recorded code bits so that errors in reading are reduced.

More specifically, according to the present invention, a laser produces one or more discrete pulses of light energy of predetermined duration as a function of said encoded data to form a region of altered reflectivity, "a pit", in the recording surface of an optical storage medium. As a result, between each pair of sequential pulses there is a predetermined cooling off period for the medium. In a series of pits, each pit produced by a pulse represents three code bits. Where a pit of length longer than a minimum length is called for by the OEM code, the pit will overlap the pit produced by an adjacent preceding pulse. The laser is off during alternate time intervals between each pulse for a duration preferably equal to the laser on time duration. Since no laser pulse is on for greater than a minimum interval, no accumulation or variation in thermal energy occurs on the media. Consequently, pit extension on the recording surface of the storage medium is controlled, in that the pit extension is constant independent of the length of the pit formed in the medium. Prior art variations in the position of pit edges resulting from differences in pit length are therefore substantially eliminated according to the present invention.

Because the present system enables the edge of each pit to be accurately defined, a decoding means is therefore enabled that detects pit edges rather than detecting the presence or absence of a pit, as is generally required with all other prior code modulation schemes. This effectively causes the density of stored data to be doubled, while reducing errors by increasing the window in which encoded data are read.

Although pit jitter and pit extension are not problems in other data transmission systems, such as magnetic data storage systems and transmission systems, the code according to the present invention is also suitable for use in those systems where the figures of merit provided by this code are desired.

BRIEF DESCRIPTION OF THE DRAWINGS

FIG. 1 illustrates timing diagrams for various prior art modulation codes. FIG. 1A illustrates the MFM code, FIG. 1B illustrates the 2,7 code, FIG. 1C illustrates the pulsed MFM code, and FIG. 1D illustrates the pulsed 2,7 code.

FIG. 2A illustrates the timing of an optical edge modulation (OEM) code according to the present invention.

FIG. 2B illustrates the state diagram for the OEM code as a function of input data bits, illustrating the five code word states generated by said code.

FIG. 2C illustrates examples of signals in non-return to zero (NRZ) format as compared with signals in return to zero (RZ) format.

FIG. 3A is a block diagram showing the basic relationship of elements of an optical data storage system.

FIG. 3B is a block diagram showing the basic relationship of elements of a magnetic data storage system.

FIG. 3C is a block diagram showing the basic relationship of elements of a data transmission system.

FIG. 4 illustrates an exemplary laser beam energy profile and resultant typical pit or hole of altered reflectivity formed in the surface of an optical medium moving with respect to said laser beam for a single pulse, of laser light energy.

FIG. 5 is a timing diagram of laser on times and the resultant four pit sizes formed thereby for encoding code bits generated by the OEM code according to the present invention.

FIG. 6 is a polarized read state diagram showing the relationship of recorded code bits to the decoded data output bits according to a preferred embodiment of the OEM decoding means according to the present invention.

FIG. 7 is a polarized write state diagram showing the relationship of input data bits to recorded code bits according to a preferred embodiment of the OEM encoding means according to the present invention.

FIG. 8 is a timing diagram illustrating an exemplary series of data bits, the operation of encoding means according to the present invention to convert said data bits into code bits according to the state diagram shown in FIG. 7, the resultant pitting formed in an exemplary optical medium, the operation of decoding means according to the state diagram of FIG. 6 to thereafter read back the coded data from said medium, and for generating output binary data bits corresponding to the input binary data bits.

FIG. 9 is a block diagram showing the preferred embodiment of encoding means according to the present invention.

FIG. 10 is a block diagram showing the preferred embodiment of decoding means according to the present invention.

FIG. 11 is a block diagram of a means fragmenting system clocking according to the present invention.

DETAILED DESCRIPTION OF THE PREFERRED EMBODIMENT

Optical recording employs a writing process that is different than that used in magnetic recording. As such, the codes that have been developed for optimal performance on magnetic recording systems are not necessarily very good for optical recording. At the present time, no optical recording system uses a code that is in common use on magnetic drives, although some optical recording systems use adaptations of common codes used for magnetic recording. Various such codes were described in the above Background. FIGS. 1A–1D illustrate timing diagrams for implementing the MFM code, the 2,7 code, the pulsed MFM code and the pulsed 2,7 code. As can be seen by comparison of the non-pulsed codes with the pulsed codes, codes used on drives using magnetic media all comprise codes where a "one" code bit indicates that the polarity of the media is to change from one state to the other, and a "zero" code bit indicates no change. When these codes are adapted for use in optical drives, a one bit means to form a pit, and a zero bit means to continue without forming a pit.

FIG. 2A illustrates the timing of an optical edge modulation (OEM) code according to the present invention. The OEM code is defined, according to the above described nomenclature to have $n=1$, $m=3$, $Td=3Tc$, $Tn=3Tc$, $Tm=9Tc$, $Ti=2Tc$. The figures of merit for the OEM code are illustrated at the bottom of Table 1. The OEM code is especially suited for writing of coded data on an optical medium and has figures of merit that exceed both the pulsed MFM code and the pulsed 2,7 code. As described herein, the OEM code enables the recording of regions of altered reflectivity in an optical medium having controlled edges, thereby achieving a balance of performance parameters that is competitive with codes used for recording data on magnetic media.

The OEM code according to the present invention is implemented using a state machine, also referred to as code conversion means. In a state machine, the next state is determined by the present state and the present input conditions. The basic state diagram for the OEM code according to the present invention is shown in FIG. 2B. As is seen, the OEM code has five different states, indicated as I–V. These code word states are shown in the boxes in FIG. 2B. As seen in each box, each code word comprises three code bits. The numbers on the lines connecting the code word state boxes represent the polarity of the next data bit received once the state machine is in a given state.

In operation, with the state machine in one state, the code bits at that state are output. When the next data bit is received, the state machine goes to the next indicated state as a function of the polarity of that next data bit. The code bits at the indicated next code word state are then output. This process continues indefinitely, and each of the five code word states are reached periodically as a function of the serially occurring binary data bit states input to the state machine.

The OEM state machine further includes a starting location, i.e., a means responsive to a first data bit for accessing a predetermined one of said five code word states. According to the present invention, means are provided for determining when a first data bit state is coupled to the state machine. If the first data bit detected is at a first polarity, code word state I is accessed, whereas if said first data bit is in an opposite second polarity state, code word state V is accessed. As described above, when either of said first or fifth code word state is accessed, three code bits defined in each state are generated in response thereto.

Complete operation of the state machine is therefore illustrated in FIG. 2B. As is seen, with the state machine at code word state I, if a data bit of a binary "1" polarity is received, the state machine reaccesses the first code word state and regenerates again the series of code bits indicated at code word state I. If a binary "0" polarity data bit is received, the state machine is caused to access code word state II and the code words therein are output. The operation of the rest of the state machine shown in FIG. 2B occurs in the same manner as described above.

It should be noted that the state machine shown in FIG. 2B is shown in NRZ format rather than in RZ format. To illustrate the distinctions between these two formats, FIG. 2C illustrates examples of signals in the non-return to zero (NRZ) format as compared with signals in the return to zero (RZ) format. As can be seen, in an NRZ format, each "1" bit illustrates a state transition from a first polarity to a second polarity and a "0" bit illustrates the absence of such a transition. In the RZ format, each "1" bit indicates a pulse and each "0" bit indicates the absence of a pulse. This distinction is very important in optical memory applications, since in magnetic recording systems, the recording medium is symmetrical, i.e., flux reversals are recorded on the media, so that it does not matter which polarity you are in at a given time. In optical recording systems, however, the recording medium is not symmetrical, in that the recording of a pit using a laser is not symmetrical with the absence of such a pit on the surface of the medium.

The apparatus for encoding and decoding data according to various embodiment of the present invention can be described by reference to the general block diagrams of FIGS. 3A, 3B and 3C.

In an optical data storage system shown in the general block diagram of FIG. 3A, binary data to be recorded is entered from a data source 178 into encoding means 179 which converts the data bits into binary code bits. The code bits are coupled to a laser pulse control 180 which causes laser 181 to generate pulses of laser light energy according to the code of the present invention so as to pit the recording surface of optical medium 182. When the data thus encoded and stored is to be read, read means 183 detects the pits on optical medium 182 and transmits the detected code bits to decoding means 184 which reconverts the code bits into binary data bits to be made available to the system user at data output 185.

In a magnetic data storage system shown in the general block diagram of FIG. 3B, binary data to be recorded is entered from a data source 186 into encoding means 187 which converts the data bits into binary code bits. The code bits are coupled into a magnetic flux control 188 which generates a magnetic flux to alter the magnetic configuration at a location on a magnetic tape or magnetic disk 189. When the data thus encoded and stored is to be read, a read means 190 detects the magnetic alterations on a magnetic tape or disk 189 and transmits the detected code bits to decoding means 191 which reconverts the code bits into binary data bits to be made available to the system user at data output 192.

In a data transmission system shown in the general block diagram of FIG. 3C, binary data to be recorded is entered from a data source 193 into an encoding means 194 which converts the data bits into binary code bits. The code bits are coupled to transmitter 195 which generates electromagnetic pulses according to the code of the present invention. The pulses are received by a receiver 196 which couples the pulses to a decoding means 197. Decoding means 197 reconverts the code bits represented by the pulses into binary data bits to be made available to the system user at data output 198.

Referring now more particularly to optical storage systems, in such systems a laser beam is focused into a spot whose diameter is about one micron, measured at the half power point of the intensity distribution ($\frac{1}{2}$ FWHM). The spot intensity distribution is approximately gaussian, i.e., it is very hot at its center and relatively cold at its edges. Such an intensity distribution for laser light energy is shown in FIG. 4. This spot of light is intensified to form a pit, or in some other way modify the reflectivity of the surface of the medium. The resultant size of the pit depends upon a number of factors such as: laser power, on time, the media pit formation mechanism, and media surface topology. An exemplary pit formation mechanism would be where the medium is moving with respect to the laser. In such a case, the size of the pit is also a function of the speed of this movement.

To form a pit, the surface of the medium must be brought up to some temperature. Because the spot intensity profile distribution is not uniform, and because the heat applied conducts away from the point of application, the heat on the surface of the medium is not uniform. The size and shape of the pit depends upon the heat profile of the medium.

Note that various types of media are available, including media where the region of the medium susceptible to alteration in reflectivity is not on the surface but at an interior layer. Similarly, the region of changed reflectivity after laser beam exposure may not be a physical deformation in the surface, but may simply be a change in the characteristic of a material.

In any encoding scheme there must be one pit size that is a minimum size. The starting point in understanding this minimum pit process is to specify that the medium is stationary. The variables in this case are the power and on time of the laser pulse. If the power level is too low, the media will never get warm enough to form a pit. If the power level is high enough, the pit size will depend only upon the amount of energy applied when the laser is pulsed. In the typical case, the size of the pit formed will depend upon both the power level and the on time. If too much energy is applied, the pit will not be the same from one pit to the next. A typical laser is capable of operating at a level where the heat dissipation during the on time is small. Note that even during the laser off time, the time during which the laser is not at a sufficient energy output to cause writing on the optical medium, the laser may still be outputting light energy. In a preferred embodiment, during so-called laser off times, the laser is still generating sufficient light energy to be able to read back data stored on the optical disk.

Since the medium must be moving with respect to the laser when the laser is pulsed on, the question is how much motion should occur for a minimum pit size. If the distance that the beam moves relative to the medium is small compared to the beam size, it is implied that the medium is moving slower than it could. Thus, the data rate would be lower than that possible. If the distance that the medium moves relative to the beam is large compared to the beam size, the heat is necessarily spread out, forming a lower temperature and a more diffuse thermal pattern on the media. Thus, pits formed in this way will be unstable, due to the lack of sharp thermal definition and inadequate heating. Therefore, an optimal amount of medium travel during a given laser pulse on-time is implied by the dual constraints of data rate, and laser power. This optimal amount of medium travel is approximately equal to one half of a beam diameter measured at the half power profile. FIG. 4 illustrates a beam profile and a resultant typical hole or pit for a single pulse of laser light energy having the indicated energy profile.

As seen in FIG. 4, with a laser on time occurring between time t1 and t2 generates a pit whose length extends from t0 to t3. This is the result of pit extension occurring on each side of the portion of the medium on which the peak intensity of the laser light energy is focused on the medium. As seen, the pit extension results from a combination of the distribution in intensity of the laser beam on the surface of the medium along with remanant thermal effects, such that alteration of the medium extends to the ½ FWHM profile point of said laser beam.

The power and speed requirements of the system can be derived from the minimum pit size process described above. When longer pits are desired, if one simply kept the laser on for a longer time, a significant problem results. The leading edge of the pit will be unaffected since the beam is moving away from it. However, the tailing edge of the pit will not only be extended from the tailing edge of the minimum pit by the added on time, it will also be affected by the accumulation of thermal energy in the medium. This presents a problem in the read/write process because the various lengths of pits are no longer simply related to the length of the on pulse.

A solution to this problem is to alternately pulse the laser on and off periodically during the formation of long pits. That is, a minimum pit is first created by a laser on time pulse. It is followed by a laser off time cooling off period. The second length of pit is formed by the first pulse plus a cooling off period, plus a second pulse to form the pit tailing edge. Other sizes of pits are formed by adding more pulses with cooling off times between each pulse.

Any code developed should have relationships of pit sizes that can be specified in terms of small integers. This is required because the read back signal is clocked against a clock that is derived from the code itself, and large integers imply complex timing circuitry.

The OEM code timing is specified by the above process and a nominal on time equal to one half of a beam diameter, and one third of a minimum pit diameter, as seen in FIG. 4. The other pit sizes are therefore determined by a nominal off time equal to the on time. The result is four hole sizes that have the durations of 3, 5, 7, and 9 laser on times. The time between pits also has durations of 3, 5, 7, and 9 laser on times. The nominal on time and off time are equal to the code bit times. These pit sizes are shown in FIG. 5. In a practical system, the actual on and off times can be changed from this nominal time by a one shot to compensate for variations in media sensitivity. The very long sync mark is specified by a laser off time of 11 code bit times, separated of course by laser on times of any legal duration.

FIG. 6 is a polarized read state diagram which can be used to derive the write state machine and the read state machine look up table. This state diagram is a polarized version of the OEM code state diagram shown in FIG. 2B because, as described above, in optical write once systems, the medium starts off in an unwritten state and changes to a written state after being exposed to laser light energy of sufficient magnitude. In the usual case where the optical media is ablative, the medium is initially free of pits on the surface of the media, except for whatever defects may exist on the surface, and, after writing of data onto the medium, pits exist at selected locations and represent coded data. Since this not a symmetrical medium, it is important to keep track of the present state of the optical medium during the recording process. An alternative way to polarizing the state diagram shown in FIG. 6 would be to simply couple the code bit output by the OEM code state diagram of FIG. 2B through a flip-flop whose output is fed to the medium. It has also been found that the polarized state diagram provides the code bits which are most easily useable, as described below, with regard to the polarized write state diagram of FIG. 7 for generation of pits of desired size on a medium according to the present invention. As in FIG. 2B, the state diagram of FIG. 6 includes a plurality code word states wherein code bits are generated at each code word state indicated by the boxes in FIG. 6. Also as in FIG. 2B, transitions from one code word state to another depend on the state of the next data bit input to the read state machine.

FIG. 7 illustrates a polarized write state diagram showing the relationship of input data bits to recorded code bits according to a preferred embodiment of the OEM encoding means according to the present invention. This state diagram is preferably derived from the above described polarized read state diagram of FIG. 6 simply by deleting every other code "1" polarity bit encountered in each string of 1's shown in the state diagram of FIG. 6. This results in a state diagram which is useable for obtaining the encoding code bits for the write state machine shown in FIG. 7. Most importantly, it can be seen that this enables the writing of long pits on a recording medium. That is, where the laser on time is equal is one-third of the length of the region of altered reflectivity formed by a pulse of laser light energy, alternating laser pulses enable the writing of pits of any desired length on the medium without generating excess thermal accumulation of energy on the medium.

The timing diagram of FIGS. 6 and 7 are best explained in relation to FIG. 8 which shows an arbitrarily chosen example of a sequence of data bits 16 sought to be encoded. FIG. 8 shows how an exemplary series of data bits 16 is converted, using clock pulses 18, into code bits 20. As will also be seen, code bits 20 are converted into write transition states 22 which are used to control the laser beam on-time. The resulting pit configuration in the surface of an optical medium is shown at 24.

The first sample data bit in FIG. 8 to be encoded, indicated at 26, is a binary "1". In the state diagram of FIG. 7 it is shown at a starting location 28. The associated arrowed line shows that the first three code bits are "000" as shown in FIG. 7 at 30 and in FIG. 8 at 32. In the preferred embodiment of the present invention, the binary code "1" represents a transition state of one polarity causing a laser on-pulse and a binary code "0" represents a transition state of the opposite polarity which causes a laser off-time. Because first sample data bit 26 was encoded at 32 into three binary "0"s, the write transition state 34 that results is that of no change in transition state from the original polarity. Therefore, during the encoding of first sample data bit 26, the laser is off and no pitting of the recording surface of the optical medium occurs.

The second sample data bit 36 is another binary "1", shown in the state diagram of FIG. 7 at 38, which is encoded into code bits "100" at 40 in FIG. 2 and as shown in FIG. 8 at 42. The binary code 42 results in the write transition state 44 indicating a change in state to one polarity for the binary "1" followed by a change of state to the opposite polarity for the first binary "0" and a continuation of the latter polarity state for the last binary "0" of the code. Therefore, the laser is turned on for the transition state of the binary "1" and off for the transition state of the binary "0". The configuration of the resulting pit on the recording surface of the optical medium is shown in FIG. 8 at 46. As indicated, the transition state 44 results in a pit Po whose leading and trailing edges are extended beyond Po by an amount of pit extension Pe which is a function of the thermal characteristics of the particular optical medium being used. Transition state 44 and pit configuration 46 have the relationship shown in FIG. 4, described above.

The third sample data bit is a binary "0" shown at 48 in FIG. 7 and at 50 in FIG. 8, which is encoded into code bits "000" at 52 in FIG. 7 and at 54 in FIG. 8. The code 54 results in the transition state 56 which is a continuation of the transition state of the preceding code because the latter code ended in a binary "0". The transition state 56 produces laser off-time and therefore no pitting as shown by pit configuration 58.

The next sample data bit 60 is another binary "0" shown in the state diagram of FIG. 7 at 62, which is encoded into the code bits "001" as shown at 64 in FIG. 7 and at 66 in FIG. 8. Binary code 66 results in the transition state 68 which indicates a continuation of the preceding state because code 66 begins with the same code bit that ended code 54. The last code bit of code 66 is a binary "1" and thus causes a change in transition state polarity, with the result that a laser pulse is generated. This pulse pits the recording surface of the optical medium with a pit of configuration 70. The pit includes an amount of pit extension at its leading and trailing edges as shown in FIG. 4 and as discussed above in relation to pit 46.

The next sequential sample data bit 72 is a binary "0", shown in the state diagram of FIG. 7 at 74, which is encoded into the code bits "000" as shown at 76 in FIG. 7 and at 78 in FIG. 8. The code 78 results in the transition state 80 which is a change of polarity state from the end of the preceding state which was set by a binary code bit "1". Transition state 80 produces laser off-time and therefore no pitting of the optical medium.

The next sample data bit 82 is a binary "1", shown in the state diagram of FIG. 7 at 84, which is encoded into the code bit "000" as shown at 86 in FIG. 7 and at 88 in FIG. 8. Binary code 88 results in the transition state 90 which is a continuation of the transition state of the preceding code because the latter ended with a binary code "0". The transition state 90 produces laser off-time and therefore no pitting of the optical medium as shown by pit configuration 92.

The next sample data bit 94 is a binary "0", shown in the state diagram of FIG. 7 at 96, which is encoded into the data bits "010" as shown at 98 in FIG. 7 and at 100 in FIG. 8. The binary code at 100 results in the transition state 102 which begins as a continuation of the polarity of the preceding transition state 90, changes polarity in response to the binary code bit "1" of the code at 100, then changes polarity again in response to the code bit "0" of the code at 100. A laser pulse is generated by the code pattern at 100 and pits the recording surface of the optical medium to produce pit configuration 104. The pit includes an amount of pit extension Pe at its leading and trailing edges as discussed above and as shown in FIG. 4.

The last sample data bit 106 is a binary "1", shown in the state diagram of FIG. 7 at 108, which is encoded into code bits "100" as shown in FIG. 7 at 40 and at 110 in FIG. 8. The code at 110 results in the transition state 112 which changes from the polarity state of preceding transition state 102 in response to the binary "1" of the code at 110, then changes the polarity state again in response to the binary code "0" of the code at 110. A laser pulse is generated by the code pattern 110 and a pit of configuration 114 is formed in the recording surface of the optical medium. In this case, the adjacent pit extensions Pe of the pits 104 and 114 overlap. This pit therefore is formed as shown for the 5T length pit illustrated in FIG. 5.

By following the logic of the state diagram of FIG. 7, the code bits resulting from the encoding of any sequence of data bit according to the present invention can be determined.

The operation the code of the present invention in the data retrieval or read mode can be described by reference to the diagram of FIG. 8 and the read state diagram of FIG. 6. In the preferred embodiment of the present invention, a pit, shown in the pit configuration 24 as an elevated segment of the line, represents a binary code "1", while a non-pitted area represents a binary code "0". For explanation of the read mode, the arbitrary pit configuration 24 will be used as a representative example for illustrating the decoding process according to the invention.

The first portion 35 of pit configuration 24 that is read shows two non-pitted segments, representing two binary code "0"s, followed by one pitted segment representing one binary code "1". Thus, the pit configuration represents code bits "001" shown at 116 in FIG. 8 and at 118 in the read state diagram of FIG. 6. The data bit corresponding to code 116 is a binary data bit "1" shown at 120 in FIG. 8 and at 122 in the state diagram of FIG. 6.

The next portion 46 of pit configuration 24 comprises two pitted segments followed by one non-pitted segment. This represents code bits "110" as shown at 124 in FIG. 8 and at 126 in the state diagram of FIG. 6. The state diagram also shows that between code 118 and 126 the binary data bit "1" is found, as shown at 128 in FIG. 6. Thus, the decoded data bit 130 in FIG. 8 is a binary "1".

Next, portion 58 of pit configuration 24 is read as three non pitted segments representing code bits "000". These bits are shown at 132 in FIG. 8 and at 134 in FIG. 6. The state diagram of FIG. 6 shows, at 136, the data bit "0" between code bits 126 and code bits 134. Thus, the decoded data bit "0" is shown at 138 in FIG. 8.

The next portion 70 of pit configuration 24 is read as a non-pitted segment followed by two pitted segments and therefore represents code bit "011" shown at 140 in FIG. 8 and 142 in FIG. 6. The state diagram of FIG. 6 shows, at 144, the data bit "0" between code bits 134 and code bits 142. This decoded data bit "0" is shown in FIG. 8 at 146.

Portion 81 of pit configuration 24 is read as a pitted segment followed by two non-pitted segments and therefore represents code bits "100" shown at 148 in FIG. 8 and at 150 in FIG. 6. The read state diagram of FIG. 6 shows, at 152, the data bit "0" between code bits 142 and code bits 150. The decoded data bit "0" is shown at 154 in FIG. 8.

The next portion 92 of pit configuration 24 is read as three non-pitted segments and represents code bits "000" shown at 156 in FIG. 8 and at 158 in FIG. 6. The state diagram of FIG. 6 shows, at 160, the data bit "1"

between code bits 150 and code bits 158. The decoded data bit "1" is shown in FIG. 8 at 162.

Portion 104 of pit configuration 24 is read as three pitted segments and therefore represents code bits "111" shown in FIG. 8 at 164 and in FIG. 6 at 166. The decoded data bit "0" is shown in FIG. 8 at 170.

The last portion of the pit configuration 24 to be read, shown at 114 in FIG. 8, indicates two pitted segments followed by one non-pitted segment, thereby representing code bits "110" shown in FIG. 8 at 172 and in FIG. 6 at 126. The state diagram of FIG. 6 shows, at 174, the data bit "1" between code bits 166 and 126. The decoded data bit "1" is entered into FIG. 8 at 176. Thus, the decoding process correctly decodes the pit configuration 24 back into data bits corresponding to the original sample data 16.

A more detailed block diagram of the encoding means according to the present invention is shown in FIG. 9. A more detailed block diagram of the decoding means according to the present invention is shown in FIG. 10. Both of these modes are driven by the clocking circuit shown in FIG. 11.

Referring first to FIG. 11, the clocking circuit is driven by either the pit edges detected on the surface of a medium during a read mode, shown at 201, or a conventional crystal oscillator 202 used during the encoding mode. These two sources of clocking pulses are fed to a phase lock loop (PLL) 200 via a conventional switch such as via AND gates 204 and 205 and invert gate 203. As seen in FIG. 11, the polarity of the encode command signal, when high, enables oscillator 202 to be coupled to the phase lock loop 200. When the encode command signal is low, inverter gate 203 enables AND gate 205 to couple the detected pit edges 201 to the phase lock loop 200 and to disconnect oscillator 202.

As will be seen, various clock pulses are required in the encoding mode and decoding mode according to the present invention. Consequently, a conventional divide-by-two 209 is used to generate a clock pulse CLK/2 whose frequency is one-half that of the clock pulse. A divide-by-three 207 enables the generation of a clock pulse of one-third the frequency of the clock pulse CLK/3 and a further divide-by-two at 208 output takes the output of the divide-by-three and generates a divide-by-six which is one-sixth as fast as the clock pulse.

Referring now to the encoding means block diagram shown in FIG. 9, data to be encoded is input at 214 to a sequence timing means 212 which functions to tell the encoder when a sync bit is to be generated. The data bit and sync bit output of sequence timer 212 is coupled to encoding means 216 which preferably comprises a read only memory (ROM) 217. This memory 217 is programmed in a conventional manner as a look up table that contains the encoding steps of the write state diagram shown in FIG. 7. This look up table determines the write transition state associated with each given data bit input, as defined by the state diagram. The identity of that state is output from the ROM 217 into a holding register 210. Holding register 210 stores this state identity. When a next data bit is coupled to encoding means 216, the previously entered write transition state identity, as stored in holding register 210, is then clocked from holding register 210 into ROM 216 and is used as a pointer for the memory 216. That is, it enables the encoding means 216 to keep track of where is it currently is in the write state diagram.

Encoding means 216 generates three code bits for each data bit according to the write state diagram of FIGS. 2B and 7. As each write transition state is generated by the ROM 217 look up table, the three code bits associated with that particular code word state is also output from ROM 217 and into holding register 210. The code bit output of encoding means 216 is loaded into shift register 218 at a rate three times that of the code word rate under the control of a LOAD pulse. This LOAD pulse is generated by the ANDing of CLK/3 and CLK/6 in an AND gate 219. The clock signal for shift register 218 is the output of divide-by-two circuitry 209. Shift register 218 converts the three parallel code bits to a serial code bit output. This serial bit string of output code bits is coupled to the laser for writing onto the optical disk or other storage medium, or for data transmission.

A RESET signal may also be coupled to holding register 210. This signal is generated when power is first applied to the system and ensures that encoding means 216 begins at the proper point in the state diagram. A RESET signal may also be generated whenever a particular writing to the optical disk has been completed so that when a next string of data bits is to be encoded, the encoding means 216 starts at a predetermined start point.

In the decoding mode shown in the block diagram of FIG. 10, the code bits are read from storage means or received from data transmission means via reading means 224. Reading means 224 may also provide the pit edge state TRANSITIONS 201 necessary to enable phase lock loop 200 to clock the decoding apparatus. The code bits read by reading means 224 are coupled to a shift register 228 which converts the serial stream of code bits into a parallel arrangement of groups of three code bits.

The output of shift register 228 includes three sets, A, B, and C, of three code bits each. One set comprises the three code bits most recently clocked into shift register 228. A second set comprises the three bits next most recently clocked into shift register 228. And the third set comprises the three bits clocked into shift register 228 just prior to the second set of code bits. This buffering capability enables the apparatus to accurately and reliably determine the transition state represented by the code bits as shown in FIG. 6. The output of shift register 228 is coupled to a decoding means 230, comprising preferably a conventional ROM memory 231, which performs the transition state look up operations defined by the read state diagram. The identity of the transition state determined for a set of code bits is clocked by CLK/6 into a holding register 232. When a given next set of code bits is coupled to decoding means 230, the identity of the previous transition state, stored in holding register 232, is coupled to ROM 231 and is used as a pointer by ROM 231. Thus, it enables the decoding means 230 to keep track of where it currently is in the read state diagram.

The decoded data bit associated with the transition state determined by decoding means 230 is clocked into either a shift register 234 for serial to parallel conversion or first into error correction code (ECC) means and then into a shift register, thus making decoded data available to the user.

During decoding, a sync pattern is detected by a compare circuit 240. The code bits read by reading means 224 are coupled to a shift register 242 that continuously converts the most recent at least ten of these bits into parallel form for detecting of the string of zero's which defines a sync bit. The actual code bit sequence tested for, in the preferred embodiment, for detecting a sync pattern is 111 000 000 000 001 11X. This sequence includes "1" code bits at each end of a string of eleven "0"s, according to the read state diagram of FIG. 6, in order to differentiate sync patterns from unwritten sections of the optical disk, wherein zero's are also found, by definition.

Although the apparatus and method of the present invention have been described and illustrated according to the preferred embodiments, modifications and variations may be made by those skilled in the art within the spirit of the invention. Such modifications or variations are within the scope of the present invention as defined by the appended claims.

What is claimed is:

1. Apparatus for encoding binary data in the form of serially occurring binary data bits into a series of signal transitions in order to effect high density data transmission comprising:
   means for converting each said data bit in series into a predetermined one of a plurality of code words according to five states of said means for converting, each code word including three code bits, wherein a "1" code bit signifies a signal transition and a "0" code bit signifies no signal transition, such that 2, 4, 6, or 8 "0" code bits are generated between each "1" code bit; and
   means for transmitting each said code word from said conversion means.

2. The encoding apparatus of claim 1 further comprising:
   means for determining when a first data bit is coupled to said conversion means, said conversion means including means responsive to said first data bit determination means for generating a first state code word when said first data bit has a first polarity and for generating a fifth state code word when said first data bit has a second polarity,
   means responsive to being in said first state and a next data bit for generating another said first state code word when said next data bit has a first polarity and for generating a second state code word when said next data bit has a second polarity,
   means responsive to being in said second state and a next data bit for generating a third state code word when said next data bit has a first polarity and for generating a fourth state code word when said next data bit has a second polarity,
   means responsive to being in said third state and a next data bit for generating another said third state code word when said next data bit has a first polarity and for generating said fourth state code word when said next data bit has a second polarity,
   means responsive to being in said fourth state and a next data bit for generating said first state code word when said next data bit has a first polarity and for generating said fifth state code word when said next data bit has a second polarity, and
   means responsive to being in said fifth state and a next data bit for generating said first state code word when said next data bit has a first polarity and for generating another said fifth state code word when said next data bit has a second polarity.

3. The encoding apparatus of claim 2 wherein said first state code word comprises code bits 001, said second state code word comprises code bits 000, said third state code word comprises code bits 010, said fourth state code word comprises code bits 000, and said fifth state code word comprises code bits 100.

4. The encoding apparatus of claim 1 wherein said conversion means further comprises means for periodically generating a synchronization signal having at least ten successive "0" bits.

5. Apparatus for encoding binary data in the form of serially occurring binary data bits into a series of signal transitions recorded on a medium comprising:
   means for converting each said data bit in series into a predetermined one of four code words according to five states of said means for converting, each code word including three code bits, wherein a "1" code bit signifies a signal transition and a "0" code bit signifies no signal transition, such that 2, 4, 6, or 8 "0" code bits are generated between each "1" code bit; and
   means for recording each said code word at a successive location on said medium.

6. The encoding apparatus of claim 5 further comprising:
   means for determining when a first data bit is coupled to said conversion means, said conversion means including means responsive to said first data bit determination means for generating a first state code word when said first data bit has a first polarity and for generating a fifth state code word when said first data bit has a second polarity.
   means responsive to being in said first state and a next data bit for generating another said first state code word when said next data bit has a first polarity and for generating a second state code word when said next data bit has a second polarity,
   means responsive to being in said second state and a next data bit for generating a third state code word when said next data bit has a first polarity and for generating a fourth state code word when said next data bit has a second polarity,
   means responsive to being in said third state and a next data bit for generating another said third state code word when said next data bit has a first polarity and for generating said fourth state code word when said next data bit has a second polarity.
   means responsive to being in said fourth state and a next data bit for generating said first state code word when said next data bit has a first polarity and for generating said fifth state code word when said next data bit has a second polarity, and
   means responsive to being in said fifth state and a next data bit for generating said first state code word when said next data bit has a first polarity and for generating another said fifth state code word when said next data bit has a second polarity.

7. The encoding apparatus of claim 6 wherein said first state code word comprises code bits 001, said second state code word comprises code bits 000, said third state code word comprises code bits 010, said fourth state code word comprises code bits 000, and said fifth state code word comprises code bits 100.

8. The encoding apparatus of claim 5 wherein said conversion means further comprises means for generating a synchronization signal having at least ten successive "0" bits.

9. The encoding apparatus of claim 5 further including decoding means for reading said code words from said medium and for reconverting said code words into binary data.

10. The apparatus of claim 9 wherein said conversion means further comprises means for generating a synchronization signal having at least ten successive "0" bits and wherein said decoding means includes means for detecting said synchronization signal on said medium.

11. The apparatus of claim 5 wherein said medium comprises a magnetic recording surface, said recording means including means for generating magnetic flux transitions on said magnetic surface as a function of the generation of each said "1" code bit.

12. The encoding apparatus of claim 5 wherein said medium comprises an optical disk having a recording surface and a laser light source, said recording means including means for moving the laser light source with respect to a track defined on the surface of said optical disk, means for causing said laser light source to generate successive pulses of laser light energy of predetermined duration as a function of said code bits, and means for focusing said laser light energy onto the surface of said optical disk such that each said pulse alters the reflectivity of a selected region of said medium.

13. The encoding apparatus of claim 12 wherein said conversion means further comprises means for converting said code words into polarized code words, each polarized code word including three polarized code bits, wherein a "1" polarized code bit signifies the on time of said pulse of laser light energy and a "0" polarized code bit signifies a laser off time, said recording means responsive to said polarized code words for forming regions of altered reflectivity in said medium having durations equal to 3, 5, 7 and 9 on times of said laser, and wherein the duration of the laser off times between each said region of altered reflectivity is set to have a duration of 3, 5, 7 and 9 on times.

14. The apparatus of claim 13 wherein said laser on time is normally equal to one-third of the length of the minimum region of altered reflectivity formed by said pulse of laser light energy.

15. The apparatus of claim 14 wherein said laser on time is adjustable as a function of the characteristics of the medium.

16. The apparatus of claim 14 wherein said regions of altered reflectivity having on time durations of 5, 7 and 9 on times are formed by generating a pulse of laser light energy during alternate intervals of laser on time for the duration of the writing of a given region of altered reflectivity on said medium.

17. The apparatus of claim 16 wherein said region of reflectivity having a duration of 5 laser on time intervals is formed by generating a pulse of laser light energy during the second and fourth laser on time interval, wherein said region of reflectivity having a duration of 7 laser on time intervals is formed by generating a pulse of laser light energy during the second, fourth and sixth laser on time interval, and wherein said region of altered reflectivity having a duration of 9 laser on time intervals is formed by generating a pulse of laser light energy during the second, fourth, sixth and eighth laser on time interval.

18. Apparatus for receiving a series of signal transitions in a data transmission and for decoding binary data from said signal transitions comprising:
means for detecting each said signal transition in said data transmission;
means for generating a periodic clock signal as a function of the occurrence of said signal transitions;
means responsive to said signal transitions for detecting a synchronization signal;
means for converting each series of three code bits defined with respect to said synchronization signal into a predetermined data bit, wherein a "1" code bit signifies a signal transition and a "0" code bit signifies the absence of a signal transition when said clock signal indicates a signal transition clock time, and wherein 2, 4, 6, or 8 "0" code bits exist between each "1" code bit, each said series of three code bits defining a predetermined one of four code words, the current and previous said code word determining whether a data bit of a first polarity or a data bit of a second polarity is generated by said decoding means; and
means for outputting each said decoded data bit.

19. In a system for storing binary bode bits stored on a medium as a series of signal transitions, an apparatus for decoding binary data from said signal transitions comprising:
means for detecting each said signal transition on a selected segment of said medium;
means for generating a periodic clock signal as a function of the occurrence of said signal transitions;
means responsive to said signal transitions for detecting a synchronization signal;
means for converting each series of three code bits defined with respect to said synchronization signal into a predetermined data bit, wherein a "1" code bit signifies a signal transition and a "0" code bit signifies the absence of a signal transition when said clock signal indicates a signal transition clock time, and wherein 2, 4, 6, or 8 "0" code bits exist between each "1" code bit, each said series of three code bits defining a predetermined one of four code words, the current and previous said code word determining whether a data bit of a first polarity or a data bit of a second polarity is generated by said decoding means; and
means for outputting each said decoded data bit.

20. A state machine for encoding a series of input binary bit, with each input bit being converted into a 3-bit output code, comprising:
a memory for storing five states for producing a 3-bit code in response to one of said binary bits, each state changing (C) or not changing (N) the polarity of a previous output bit, with a state I(NNC), state II(NNN), state III(NCN), state IV(NNN) and state V(CNN);
means for sequencing through said states based on a present state and a next input bit such that
for present state I, a next input 0 causes a transition to state II and a next input 1 causes a transition back to state I,
for present state II, a next input 0 causes a transition to state III and a next input 1 causes a transition to state IV,
for present state III, a next input 0 causes a transition back to state III and a next input 1 causes a transition to state IV,
for present state IV, a next input 0 causes a transition to state V and a next input 1 causes a transition to state I,
for present state V, a next input 0 causes a transition back to state V and a next input 1 causes a transition to state I.

21. The state machine of claim 20 further comprising a memory element for storing a synchronization state for generating a synchronization pattern; and
   means for selectively transitioning to said synchronization state between any two of said states.

22. The state machine of claim 20 wherein said state machine is polarized with each of said states including two polarized states (A and B) so that an N (not changing) and a C (changing) are a 1 in one polarization and a 0 in the other, giving states of:
   state IA (001), state IB (110),
   state IIA (111), state IIB (000),
   state IIIA (100), state IIIB (011),
   state IVA (000), state IVB (111), and
   state VA (111), state VB (000), wherein the transitions back to the same state are to the opposite polarity of that state.

23. The state machine of claim 22 wherein said states are modified to remove every odd 1 appearing in possible output sequences of said code bits for use with a laser which will produce a pit for each 1, each pit being large enough to be read back as 3 ones, such that the states become:
   state IA (000), state IB (100),
   state IIA (101), state IIB (000),
   state IIIA (000), state IIIB (001),
   state IVA (000), state IVB (010), and
   state VA (010), state VB (000).

24. The state machine of claim 22 further comprising means for sequencing said state machine to recreate said series of input binary bits upon the reading of a code corresponding to said states.

25. A state machine for encoding a series of input binary bits, with each bit being converted to a 3-bit output for writing onto an optical media such that each "1" corresponds to a laser being turned on, comprising:
   a memory for storing states with said 3-bit codes, said states being
   state IA (000), state IB (100),
   state IIA (101), state IIB (000),
   state IIIA (000), state IIIB (001),
   state IVA (000), state IVB (010), and
   state VA (010), state VB (000); and
   means for sequencing through said states based on a present state and a next input bit such that
      present state IA, next input 0 goes to state IIA, 1 goes to state IB,
      present state IB, next input 0 goes to state IIB, 1 goes to state IA,
      present state IIA, next input 0 goes to state IIIA, 1 goes to state VA,
      present state IIB, next input 0 goes to state IIIB, 1 goes to state VB,
      present state IIIA, next input 0 goes to state IIIB, 1 goes to state IVA,
      present state IIIB, next input 0 goes to state IIIA, 1 goes to state IVB,
      present state IVA, next input 0 goes to state VA, 1 goes to state IA,
      present state IVB, next input 0 goes to state VB, 1 goes to state IB,
      present state VA, next input 0 goes to state VB, 1 goes to IB,
      present state VB, next input 0 goes to state VA, 1 goes to IA.

26. The state machine of claim 25 further comprising a synchronization state between two of said states for producing a synchronization pattern.

27. A state machine for decoding a series of 3-bit corresponding to different states to produce an output binary bit stream, comprising:
   means for recognizing codes corresponding to
   state IA (001), state IB (110),
   state IIA (111), state IIB (000),
   state IIIA (100), state IIIB (011),
   state IVA (000), state IVB (111),
   state VA (111), state VB (000); and
   means for producing output bits upon transitions between states such that
   states IA to IB and IB to IA produces 1,
   states IA to IIA and IB to IIB produces 0,
   states IIA to VA and IIB to VB produces 1,
   states IIA to IIIA and IIB to IIIB produces 0,
   states IIIA to IVA and IIIB to IVB produces 1,
   states IIIA to IIIB and IIIB to IIIA produces 0,
   states IVA to IA and IVB to IB produces 1,
   states IVA to VA and IVB to VB produces 0,
   states VA to IB and VB to IA produce 1, and
   states VA to VB and VB to VA produces 0.

28. The state machine of claim 27 further comprising means for recognizing a synchronization code corresponding to a synchronization state between a specified two of said states.

* * * * *